US006414398B1

(12) United States Patent
Wolf

(10) Patent No.: US 6,414,398 B1
(45) **Date of Patent: *Jul. 2, 2002**

(54) RESIN CERAMIC COMPOSITIONS HAVING MAGNETIC PROPERTIES

(75) Inventor: Ronald J. Wolf, Elkhart, IN (US)

(73) Assignee: Dana Corporation, Toledo, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/665,796

(22) Filed: Sep. 20, 2000

Related U.S. Application Data

(62) Division of application No. 09/250,930, filed on Feb. 18, 1999, now Pat. No. 6,274,939

(60) Provisional application No. 60/099,900, filed on Sep. 11, 1998.

(51) Int. Cl.[7] .................................................. H01L 23/29

(52) U.S. Cl. ........................................ 257/795; 257/789

(58) Field of Search ................................ 257/787, 795, 257/789, 783, 782, 701; 438/112, 124, 126, 118

(56) References Cited

U.S. PATENT DOCUMENTS

| | | | | |
|---|---|---|---|---|
| 3,885,977 | A | | 5/1975 | Lachman et al. |
| 4,042,550 | A | | 8/1977 | Tuller et al. |
| 4,063,970 | A | | 12/1977 | Steingroever et al. |
| 4,358,552 | A | | 11/1982 | Shinohara et al. |
| 4,697,863 | A | | 10/1987 | Galloway et al. |
| 4,700,091 | A | | 10/1987 | Wuthrich |
| 4,708,909 | A | * | 11/1987 | Ohtsuki et al. |
| 4,749,434 | A | | 6/1988 | Harrison et al. |
| 4,826,616 | A | | 5/1989 | Tanino et al. |
| 4,882,455 | A | | 11/1989 | Sato et al. |
| 4,970,463 | A | | 11/1990 | Wolf et al. |
| 5,206,554 | A | | 4/1993 | Perrot |
| 5,208,188 | A | | 5/1993 | Newman |
| 5,226,221 | A | | 7/1993 | Kilgore |
| 5,237,205 | A | | 8/1993 | Newman |
| 5,244,747 | A | | 9/1993 | Lee |
| 5,250,925 | A | | 10/1993 | Shinkle |
| 5,278,496 | A | | 1/1994 | Dickmeyer et al. |
| 5,305,507 | A | | 4/1994 | Dvorsky et al. |
| 5,360,837 | A | | 11/1994 | Honda et al. |
| 5,381,089 | A | | 1/1995 | Dickmeyer et al. |
| 5,389,889 | A | | 2/1995 | Towne et al. |
| 5,441,918 | A | | 8/1995 | Morisaki et al. |
| 5,449,480 | A | | 9/1995 | Kuriya et al. |
| 5,488,294 | A | | 1/1996 | Liddell et al. |
| 5,504,424 | A | | 4/1996 | Graf et al. |
| 5,507,089 | A | | 4/1996 | Dickmeyer |
| 5,510,649 | A | | 4/1996 | Adhihetty et al. |
| 5,543,674 | A | | 8/1996 | Koehler |
| 5,543,676 | A | | 8/1996 | York et al. |
| 5,579,188 | A | | 11/1996 | Dunfield et al. |
| 5,600,516 | A | | 2/1997 | Phillips et al. |
| 5,612,842 | A | | 3/1997 | Hickox et al. |
| 5,629,618 | A | | 5/1997 | Babin et al. |
| 5,650,719 | A | | 7/1997 | Moody et al. |
| 5,650,896 | A | | 7/1997 | Viskochil |
| 5,654,849 | A | | 8/1997 | Hassibi et al. |
| 5,661,094 | A | | 8/1997 | Feltz et al. |
| 5,672,927 | A | | 9/1997 | Viskochil |
| 5,694,038 | A | | 12/1997 | Moody et al. |
| 5,729,130 | A | | 3/1998 | Moody et al. |
| 5,851,644 | A | * | 12/1998 | McArdle et al. |
| 5,853,846 | A | * | 12/1998 | Clark et al. |
| 6,048,601 | A | | 4/2000 | Yahagi et al. |
| 6,110,399 | A | * | 8/2000 | McArdle et al. |
| 6,136,429 | A | | 10/2000 | Saito et al. |
| 6,149,857 | A | * | 11/2000 | McArdle et al. |
| 6,180,226 | B1 | * | 1/2001 | McArdle et al. |

* cited by examiner

*Primary Examiner*—Sheila V. Clark
(74) *Attorney, Agent, or Firm*—Katten Muchin Zavis Rosenman

(57) ABSTRACT

The present invention is directed to a resin ceramic composition that includes a ceramic filler in an amount effective for providing a single composition with a magnetic field of at least one gauss.

5 Claims, No Drawings

RESIN CERAMIC COMPOSITIONS HAVING MAGNETIC PROPERTIES

CROSS-REFERENCE TO RELATED APPLICATIONS

This is a division, of prior application Ser. No. 09/250,930, filed Feb. 18, 1999 now U.S. Pat. No. 6,274,939 which is hereby incorporated herein by reference in its entirety.

This application claims benefit of U.S. Provisional Application No. 60/099,900, filed Sep. 11, 1998.

BACKGROUND OF THE INVENTION

1. Field of the Invention

The present invention relates to resin ceramic compositions. More particularly, the resin ceramic compositions of the invention include a ceramic that provides the composition with magnetic properties.

2. Description of the Prior Art

A variety of resins are used in connection with devices having magnetic or electronic uses. Often the resin serves as a package or as a support structure onto which other devices are attached. Hence, the resin must be further processed to provide a finished product.

Semiconductor devices are packaged and encapsulated in a variety of resinous materials, including epoxy. Epoxy resins have excellent heat resistance, moisture resistance, electrical characteristics and adhesion properties, and they can acquire various characteristics with the addition of modifying agents. Accordingly, epoxy resins are used for packaging microelectronic components, such as integrated circuits.

The epoxy compositions used in electronic applications may include a hardener and fillers. The fillers are utilized to provide the epoxy resin with desirable characteristics such as a low coefficient of thermal expansion and high thermal conductivity. Commonly used fillers include inorganic fillers used in combination with epoxy include silica, quartz, alumina, fiber glass, calcium silicate, a variety of earths and clays, and combination thereof. Examples of epoxy compositions which include various types of fillers which are used in electronic applications are described in U.S. Pat. No. 4,042,550.

One type of semiconductor device which utilizes epoxy compositions, are proximity sensing devices, such as a Hall effect sensor. A Hall effect sensor relies on a change of magnetic flux density applied to a sensing plane of a Hall effect element. A detailed description of Hall effect sensors is set forth in U.S. Pat. Nos. 5,729,130, 5,694,038, 5,650,719, 5,389,889 and 4,970,463, and the operation of a number of different Hall effect type sensors is described in Allegro (formerly Sprague) Data Book SN-500.

In a representative Hall effect sensor as shown in U.S. Pat. No. 4,970,463, a magnet is mounted a fixed distance from a sensing plane of a Hall effect sensor element, defining an air gap and forming an assembly. The manufacture of such assemblies requires that the magnet be mounted in a particular orientation relative to the sensing plane. Various techniques are known for fixing the position of the Hall effect sensor, such as potting or overmolding. In one known overmolding technique, the magnet is overmolded onto an existing semiconductor which is already encapsulated in a package. The addition step of adding or overmolding a magnet to the semiconductor increases the complexity and cost of manufacture of such devices.

In addition to the increased manufacturing cost, a common shortcoming of such sensing devices is the dependence of the output of the device on the airgap between the device and the magnet which may vary on a part to part basis. More specifically, as the air gap between the magnet and the semiconductor increases, the maximum output range of the device decreases, decreasing the sensitivity of the sensor. Thus, there is a need to provide a reduced cost Hall effect sensor with relatively consistent repeatable output characteristics.

SUMMARY OF THE INVENTION

Briefly, the present invention relates to a resin ceramic composition and provides a number of properties heretofore not available in a single composition. In an important aspect of the invention, the resin ceramic composition is capable of providing a magnetic field. Hence, the use of the resin ceramic compositions of the invention eliminates the need to use a separate magnet and thus significantly reduces the cost of such devices requiring external magnet fields.

In one aspect of the present invention, the resin ceramic composition is an epoxy ceramic composition suitable for encapsulating an integrated circuit. Two embodiments of this aspect the invention are contemplated. In one embodiment the composition is overmolded over an already encapsulated integrated circuit. In another embodiment of the invention, the composition is used as the only encapsulation for the integrated circuit die. In both embodiments, the use of the composition eliminates the need for an external magnet, significantly reducing the cost of the sensor and providing relatively consistent repeatable output characteristics. Further, the use of the resin ceramic composition of the invention as a package or overmold provides a relatively repeatable and consistent air gap, and thus, increases the sensitivity of the device used with a similar type magnetic material. Since the magnetic field strength is temperature dependent in one aspect of the invention, the composition may be based on a resin that is able to provide suitable output over an anticipated temperature range of −40° C. to 150° C., which makes the composition attractive for sensors used in automotive applications.

The composition of the invention includes a resin, and an amount of ceramic filler effective for providing the composition with a magnetic field strength of at least about 1 gauss. The ceramic filler may include strontium ferrite, barium ferrite, or mixtures thereof. When the resin is an epoxy, and the epoxy ceramic composition is used to encapsulate an integrated circuit, the ceramic filler may have a particle size of about 1.5 microns or less. The relatively small particle size and shape provides an additional advantage in that it provides less stress on the semiconductor than other compositions used for encapsulation.

The present invention also provides a process for preparing a resin ceramic composition. In accordance with the process of the present invention, a resin is blended with a ceramic filler in an amount effective for providing the resulting composition with a magnetic field of at least about 1 gauss. The resin ceramic filler blend is exposed to a magnetic field to orient magnetic dipoles within the composition.

The present invention also provides a process for preparing a resin molding composition capable of conversion to a thermoset condition upon application of heat which is suitable for encapsulating semiconductor devices. The process provides a composition having properties compatible for use with semiconductor device, and a magnetic field of at least about 1 gauss. In accordance with this aspect of the present invention, a resin composition is blended with a hardener, if necessary, and a ceramic filler in an amount effective for providing the resulting composition with a magnetic field of at least about 1 gauss. In an important aspect of the invention, the ceramic filler may include a dielectric that has magnetic properties such as barium ferrite, strontium ferrite, and mixtures thereof. The resin/hardener/ceramic filler blend is heated to a temperature for a predetermined time effective for crosslinking the composition. The resin/hardener/ceramic filler blend may be isotropic or anisotropic (i.e. non-magnetically oriented or magnetically oriented).

DETAILED DESCRIPTION

The present invention provides a resin having magnetic properties. In one aspect of the invention, the resins may be used in connection with various types of magnetic responsive sensors. Examples of magnetic flux responsive sensors include Hall effect sensors, discrete, hybrid or integrated circuits which include Hall effect sensors such as application specific integrated circuits (ASIC), reed switches, magneto resistive sensors (MRS) such as a hybrid, discrete or integrated circuit including an MRE, and magnetic axial contact switches and the like as generally described in U.S. Pat. No. 4,970,463, herein incorporated by reference. Any sensor which provides an output signal in response to a change in magnetic flux density can be fabricated by the method in accordance with the present invention.

Resins useful in the present invention may include thermoplastic and thermoset resins. Representative examples of resins that may be used in the present invention include epoxy, polyester, polypropylene, polyethylene, polybutylene, polycarbonate, styrene, sulfone based resins, and polyamide-imide.

The particular resin utilized depends on the application, in particular, resins have known characteristics selected for the application in which the resin is used. Since the invention is directed to the addition of magnetic materials to form a magnetic resin, a specific embodiment of a single resin, epoxy, is describe by way of example. The selection and application of other resins without magnetic properties are with the ordinary skill in the art. These resins can be formulated into magnetic resins in accordance with the present invention.

In one aspect of the invention, the resin is an epoxy and the epoxy composition of the present invention provides a single composition for encapsulating semiconductor devices either by overmolding an already encapsulated integrated circuit or as the only encapsulation for the integrated circuit die. In both embodiments, the use of the composition eliminates the need for a discrete magnet, significantly reducing the cost of the sensor and providing relatively consistent repeatable output characteristics.

The epoxy composition in accordance with one aspect of the present invention may be selected to provide certain properties that make it compatible and appropriate for use in semiconductor devices. In this aspect of the invention, the resinous material applied to the electronic device is compatible with the electronic device such that the material does not chemically or physically interfere with the device. For example, the resinous composition is relatively free of ions, such as chlorine, bromine, and fluorine, which may chemically react to form corrosive compounds. As used herein, "Relatively free of ions" means that the epoxy composition has less than typical amount chlorine, bromine, fluorine or any combination thereof typically used for encapsulation of semiconductor dies. Further, the epoxy composition provides adequate sealing of leads to prevent penetration of moisture and ionic contaminants which can also promote degradation of the semiconductor device.

In another important aspect, the resin composition of the invention may provide a low coefficient of thermal expansion when this property is needed. Due in large part to the increasing complexity of semiconductors, such semiconductors have become more vulnerable to thermally-induced stress. The use of an encapsulant composition which does not have a low coefficient of thermal expansion can cause premature failure due to cracking of chips, wire breakage and parametric shift. The resin composition of the present invention is effective for use in semiconductors where large thermally induced internal stress might normally occur due to applications subject to relatively wide temperature ranges.

In addition to a low coefficient of thermal expansion, the resin composition may also be formulated to provides a high thermal conductivity for those applications where this property is important. Semiconductor devices of high circuit density generate more heat per unit area than devices of low circuit density, requiring the rapid dissipation of heat through the encapsulant in order to insure cooler operation and a long operating life. It is widely accepted in the electronics industry that a increase of 10° C. in junction temperatures decreases the life expectancy of a semiconductor device by one half. Therefore, the property of high thermal conductivity, i.e. rapid dissipation of heat, is necessary to the efficient operation and long life of a microelectronic device.

Epoxy Resin

In one aspect, the epoxy resin component of the compositions of the present invention are those having more than one epoxide group and may be of any of those used in molding compositions, such as the diglycidyl ethers of bisphenol A, Glycidyl ethers of phenol-formaldehyde resins, aliphatic, cycloaliphatic, aromatic and heterocyclic epoxies.

Some commonly used epoxy resins include epoxies prepared by the reaction of epichlorohydrin with bisphenol A, or with hydrogenated bisphenol A, or with bisphenol F, or with Novolac phenolic resins, or with polyols such as glycerol, sorbitol, polyethylene or polypropylene glycol. As an example the structure of polyethylene glycol diglycidal ether is shown below.

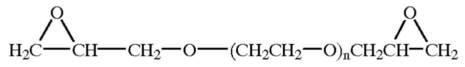

Epoxy resins useful in the present invention are commercially available under a variety of trademarks, such as "Epon", "Epi-Rez", "Genepoxyl" and "Araldite", to name a few. Epoxylated novolac resins are also useful in this invention and are available commercially under the trademarks "Ciba ECN" and "Dow DEN".

Hardeners, also known as curing agents, which may be used herein are any of those commonly used for the purpose of cross-linking the epoxy resin and causing it to form a hard and infusible mass. These hardeners are well known in the art and the use of any particular one or combination thereof and is acceptable. Examples of hardeners or curing agents which may be used include anhydrides such as phthalic anhydride, tetrachlorophthalic anhydride, benzophenonetetracarboxylic dianhydride (BTDA), pyromellitic dianhydride (PMDA), the dianhydride of 1,2,3,4-cyclopentanetetracarboxylic acid (CPDA), trimellitic anhydride, trimellitic double anhydride, and nadic anhydride; novolacs; and amines such as diamines, aromatic amines, methylene dianiline, m-phenylene diamine, and m-tolylene diamine.

Generally, the amount of hardener added to the epoxy will depend upon the desired properties of the end product. For example, about 10% or more of hardener is used, based on the stoichiometric amount of the epoxy groups present.

Fillers

The ceramic fillers of the present invention may be blended with any resin as described herein. The ceramic filler may be blended with the resin and/or the hardener before the composition is allowed to harden and also before curing in the presence of a magnetic field for orienting magnetic dipoles in the composition. In an important aspect of the invention, the epoxy/hardener is blended with a magnetic ceramic filler.

Magnetic ceramic fillers useful in the present invention are dielectric ceramics which act as electric insulators and are thus not electrically conductive. The magnetic ceramic fillers of the invention provide a magnetic field of at least about 1 gauss and can provide a magnetic field of up to at least about 150 gauss and up to 600 gauss and higher depending upon the percentage of magnetic ceramic filler. The magnetic field provided by the composition is at least about 1 gauss at a temperature range from about −40° C. to about 150° C. In particular, the magnetic temperature co-efficient for the composition is about −0.19%/° C. In other words, the magnetic flux is reduced by 0.19% for each degree of temperature change relative to 25° C. Thus at a 150° C., the gauss output of the composition will be reduced by about 24%.

In a very important aspect, ceramic fillers of the present invention include strontium ferrite, barium ferrite and any equivalents. In another very important aspect, when the composition is used with semiconductor devices, the ceramic has a particle size of about 1.5 microns. The small particle size allows for adequate dispersion of the ceramic filler in the epoxy resin and provides the resin with the desired properties of thermal expansion and conductivity. Further, smaller particle size results in less stress on the integrated circuit die.

Additives

A variety of adjuvants may be added to the epoxy molding composition to provide special properties. Thus, catalysts, mold release agents, pigments, flame retardants, and coupling agents are generally employed in addition to the epoxy resin, hardener and filler.

Preparation of Semiconductor Devices with Epoxy Overmold or Potting

In one important aspect of the invention, epoxy resin as described above is blended with hardener and with a magnetic ceramic filler. The blend will contain an amount of ceramic filler effective for providing the final composition with a desired magnetic field of at least about 1 gauss. In one very important aspect, the blend will contain from about 40 to about 65 percent by weight preferably 50 percent by weight, ceramic filler, based on the weight of the resin/hardener/ceramic filler blend.

The resin/hardener/ceramic filler blend is overmolded or potted onto a semiconductor which is already packaged. Hardening or cross-linking of the epoxy resin is then effected by heating the composition. In an important aspect, heating is conducted at about 115° C. about 60 minutes.

The resin/hardener/ceramic filler blend may be isotropic or anisotropic (i.e. non-magnetically oriented or magnetically oriented). In an anisotropic embodiment, curing of the epoxy is done in the presence of a magnetic field. Magnetic orientation may be effected by application of a suitable magnetic field, well known within the ordinary skill in the art.

Encapsulation of Semiconductor Die

In another important aspect of the invention, the compositions of the present invention are used to encapsulate a semiconductor die. As used herein, a semiconductor die is a portion of a semiconductor wafer formed by conventional integrated circuit techniques. Such dies normally include bond pads for connection to internal electrical circuits. In particular, various known methods are known for connecting the bonds on bond frames. The die and bonds are encapsulated in a package, normally an epoxy composition.

In an important aspect of the present invention, epoxy compositions normally used to encapsulate a semiconductor are substituted with the composition in accordance with the present invention by known techniques. The method of the present invention provides a device having a decreased or zero air gap. This method reduces the internal air gap between the die and the magnetic fields.

EXAMPLES

Example 1

Thermal Conductivity

Thermal Conductivity is a measure of the capacity of a material for conducting heat. The Colora Thermoconductometer is used, based upon a method devised by Dr. J Schroeder (Ger. Pat. No. 1,145,825) to measure the thermal conductivity of plastic materials.

In this method, a cylindrical sample of material is placed between two boiling chambers containing two different pure liquids having 10°–20° C. difference in boiling points. The liquid in the lower chamber is heated to boiling, the heat transfers through the material to boil the liquid in the upper chamber. The time is measure for a given quantity of heat to flow through the sample to cause 1 ml of liquid from the upper boiling chamber (cold side) to evaporate and condense in a burette. The time required to evaporate and condense 1 ml of liquid by passing heat through the sample is compared to a known standard.

To test for thermal conductivity, a 0.70"×⅛" disc of the material to be tested is molded. This disc is placed in the thermoconductometer and tested as aforesaid.

The thermal conductivity (τ) of the plastic in cal./°C./cm/sec. is calculated as follows:

$$\lambda = \frac{Q}{t \cdot (T_A - T_B)} \cdot \frac{h}{F}$$

where

Q=heat off vaporization for 1 ml of liquid B.

t=time in seconds for distilling 1 ml.

$T_A - T_B$=temperature difference in ° C. which is given by the boiling points of the two liquids.

h=sample height in cm.

F=sample cross-section in $cm^2$.

A τ value greater than $25\times10^{-4}$ is highly desirable for encapsulates for electronic devices.

Example 2

Thermal Expansion

Linear coefficient of thermal expansion is a measure of reversible heat induced expansion of any material. A Thermal Mechanical Analyzer is used to measure the expansion characteristics of a molded epoxy or plastic composition.

Plastic materials at some temperature reach a glossy state where the polymer chains begin to relax. This temperature is referred to as the Glass Transition Temperature ($T_g$) of the plastic. The average coefficient of thermal expansion below $T_g$ is called $\alpha_1$. The average coefficient of thermal expansion above $T_g$ is called $\alpha_2$.

To determine $\alpha_1$, $\alpha_2$, and $T_g$ of plastic material, a test specimen comprising a cylindrical sample 0.2"×0.2" is molded in a transfer molding press using a temperature of 350° F. and a pressure of 1000 psi. This test specimen is post cured at a temperature and for a period of time predetermined for each material.

The post cured specimens is then placed into the quartz tube chamber of the Thermal Mechanical Analyzer. A quartz displacement probe is positioned on top of the specimens. The chamber is then heated at a predetermined rate (usually 5° C./minute). The expansion of the plastic is sensed by a transducer which transfers the information to an XY recorder. The Thermogram produced shows displacement versus temperature.

To determine $T_g$, the best tangent lines for the lower part of the displacement/temperature curve and the upper section are drawn. The temperature at the intersection of these two tangent lines is the glass transition temperature.

$\alpha_1$ and $\alpha_2$ can be calculated as follows:

$$\alpha = \frac{L_1 \times A}{L_0 \times T} \times F$$

Where $\alpha$=Average linear coefficient of thermal expansion in the inches/inch/° C.

$L_1$=Displacement in inches

A=Sensitivity of the Y' axis $L_o$=Original length of the sample in inches

T=Temperature range used for determining TE

F=Calibration factor

Although both $\alpha_1$ and $\alpha_2$ values are determined in this and in all subsequent examples, the $\alpha_1$ value, the linear coefficient of thermal expansion below the glass transition temperatures ($T_g$) is the significant thermal expansion coefficient for evaluating the performance of epoxy molding compositions for encapsulating electronic devices. An $\alpha_1$ value less than $23\times10^{-6}$ is highly desirable for an encapsulant for electronic devices.

Example 3

Determination of Thermal Conductivity, Tg and CTE

Thermal conductivity was determined by way of a C-Matic Model TCHM-DV thermal conductivity test apparatus and the procedures provided therewith. More specifically, the instrument was calibrated using a pyrex standard. Samples were prepared as follows:

| Sample Designation | Description |
|---|---|
| 100–65 | 100 grams of epoxy resin, 65% filler, 27.4 grams of hardener |
| 85–70 | 100 grams of epoxy resin, 70% filler, 23.3 grams of hardener |
| 85–65 | 100 grams of epoxy resin, 65% filler, 23.3 grams of hardener |
| 85–40 | 100 grams of epoxy resin, 40% filler, 23.3 grams of hardener |

Percent filler is based on the combined weight of the epoxy resin and hardener.

Samples were exposed to a magnetic flux to orientate the magnetic dipoles in the filler. Samples where cured as indicated in Table 1 and analyzed using the C-Matic Model TCHM-DV in accordance with manufacturers instructions. Thermal conductivity results are shown in Table 1. Alternatively, the compound could be utilized with non-orientated magnetic dipoles.

The samples described above were also tested to determine Tg (glass transition) using ASTM D-3418 and coefficient of thermal expansion using ASTM E-831. Results of these tests are set forth in Table 1.

TABLE 1

The following sample designations correspond to: mix stoichiometry - percent filler - presence of magnetic field during cure
All the samples were cured for 2 hours at 125° C., followed by 2 additional hours at 150° C.

Thermal Conductivity
Conditions: Readings recorded after samples were allowed to equilibrate to 100° C. for 15 minutes

| Sample | Th (inc.) | Thick (m) | Tu | Tg | Tl | Th | Q | dT/Q | s (meas.) | W/mK |
|---|---|---|---|---|---|---|---|---|---|---|
| 85–65-no magnet | 0.2560 | 0.0065024 | 3772 | 4079 | 4850 | 5320 | 3330 | 0.323724 | 0.025155 | 0.25850 |
| 85–65-magnet | 0.2560 | 0.0065024 | 3771 | 4082 | 4840 | 5318 | 3440 | 0.310756 | 0.024059 | 0.27027 |
| 85–70-no magnet | 0.2600 | 0.0066040 | 3770 | 4078 | 4836 | 5316 | 3440 | 0.309884 | 0.023985 | 0.27534 |
| 85–70 magnet | 0.2590 | 0.0065786 | 3770 | 4076 | 4850 | 5318 | 3360 | 0.321429 | 0.024961 | 0.26356 |
| 100–65-no magnet | 0.2540 | 0.0064516 | 3768 | 4087 | 4882 | 5315 | 3163 | 0.352197 | 0.027561 | 0.23409 |
| 100–65-magnet | 0.2530 | 0.0064262 | 3771 | 4078 | 4855 | 5316 | 3375 | 0.321185 | 0.024940 | 0.25766 |

Tg and CTE
Conditions: Samples subjected to a temperature range from 25° C. to 250° C. at a rate of 15° C./min.

| Sample | Tg | CTE below Tg | CTE above Tg |
|---|---|---|---|
| 85–65-no magnet | 180.7 | 6.00E−05 | 1.48E−04 |
| 85–65-magnet | 176.4 | 6.55E−05 | 1.48E−04 |

TABLE 1-continued

The following sample designations correspond to: mix stoichiometry - percent filler - presence of magnetic field during cure
All the samples were cured for 2 hours at 125° C., followed by 2 additional hours at 150° C.

| | | | |
|---|---|---|---|
| 85–40-no magnet | 183.6 | 5.56E–05 | 1.44E–04 |
| 85–70-magnet | 176.2 | 5.90E–05 | 1.43E–04 |
| 100–65-no magnet | 173.4 | 6.31E–05 | 1.51E–04 |
| 100–65-magnet | 179.4 | 5.87E–05 | 1.47E–04 |

Example 4

Preparation of Overmold

Epoxy resin (MJT-010-018, from ThermosetPlastics, Indianapolis, Ind., was blended with a ceramic filler barium ferrite to provide a resin having about 62.5 percent by weight of ceramic filler. The resin/filler (100 grams) was the blended with 27 grams of hardener (EP 830).

A semiconductor device, for example, an Allegro model ATS 640 sensor with the magnet removed was placed into a preheated mold and the epoxy/filler/hardener blend was poured into the resin/filler/hardener such that the sensor was encapsulated with the blend. The mold is heated to 115° C. The bottom of the mold included a magnet having sufficient strength to orient magnetic poles in the ceramic.

After heating the composition in the mold at about 115° C. for about 60 minutes, the hardened encapsulated semiconductor was removed from the mold.

Example 5

Measurement of Gauss Levels

Epoxy resin was prepared as indicated in Example 4 and blended with magnetic ceramic filler in the percentages indicated in Table 2. Samples were exposed to a magnetic flux to orientate the magnetic dipoles in the filler. Alternatively, samples were not exposed to magnetic flux such that dipoles were not oriented. Gauss levels were measured and are set forth below in Table 2.

TABLE 2

| Sample | 30* | 40* | 50* | 60* | 70* | 80* |
|---|---|---|---|---|---|---|
| oriented | 248.2 | 351.9 | 462.2 | 506.8 | 594.8 | 649.3 |
| non-oriented | 94.82 | 183.84 | 256.7 | 156.35 | 226.3 | 352.7 |

*Percentage of magnetic ceramic filler

What is claimed is:

1. A semiconductor device encapsulated in an epoxy ceramic composition, the epoxy ceramic composition comprising an epoxy resin; a hardener; and an amount of ceramic filler effective for providing the composition with a magnetic field of at least about 1 gauss.

2. A semiconductor device according to claim 1 wherein the ceramic filler is selected from the group consisting of strontium ferrite, barium ferrite, and mixtures thereof.

3. A semiconductor device according to claim 1 wherein the ceramic filler has a particle size of less than about 1.5 microns.

4. A semiconductor device according to claim 1 wherein the semiconductor device is a Hall effect sensor.

5. A semiconductor device according to claim 4 wherein the Hall effect sensor has an airgap of about zero.

* * * * *